United States Patent [19]
Shiratake

[11] Patent Number: 6,018,481
[45] Date of Patent: Jan. 25, 2000

[54] DYNAMIC SEMICONDUCTOR MEMORY DEVICE

[75] Inventor: Shinichiro Shiratake, Yokohama, Japan

[73] Assignee: Kabushiki Kaisha Toshiba, Kawasaki, Japan

[21] Appl. No.: 09/174,534

[22] Filed: Oct. 19, 1998

[30] Foreign Application Priority Data

Oct. 22, 1997 [JP] Japan .................................. 9-289351

[51] Int. Cl.[7] ..................................................... G11C 7/00
[52] U.S. Cl. .......................... 365/190; 365/203; 365/200; 365/189.11
[58] Field of Search .................................... 365/203, 200, 365/189.11, 225.7, 96, 190

[56] References Cited

U.S. PATENT DOCUMENTS 5,642,314  6/1997  Yamauchi ........................... 365/189.06
5,673,231  9/1997  Furutani ............................. 365/203

OTHER PUBLICATIONS

T. Kirihata et al.; IEICE Trans. Electron, vol. E79–C No. 7; "Fault–Tolerant Designs for 256 Mb DRAM"; Jul. 1996; pp. 969–977.

*Primary Examiner*—Vu A. Le
*Attorney, Agent, or Firm*—Banner & Witcoff, Ltd.

[57] ABSTRACT

A dynamic semiconductor memory device can suppress an increase in the amount of current in the stand-by state even if the defect of short circuit occurs between a bit line and a word line by using a current limiting element controlled by a column selection line, for limiting the precharge current for the bit line.

19 Claims, 10 Drawing Sheets

//6,018,481

DYNAMIC SEMICONDUCTOR MEMORY DEVICE

BACKGROUND OF THE INVENTION

This invention relates to a dynamic semiconductor memory device and more particularly to a precharge circuit system for bit lines for suppressing current consumption in the stand-by state even if the defect of short circuit occurs between a bit line and a word line.

As the processing technology of semiconductor substrates is more developed, the size of elements used in the semiconductor memory device gradually becomes smaller. Accordingly, the processing pitch of wirings, for example, in the semiconductor memory device is made smaller and the rate of generation of defects of short circuits between wirings due to a fluctuation in the processing caused in the manufacturing process or dusts in a clean room in which the process is effected becomes higher.

In the internal portion of the dynamic semiconductor memory device, generally, word lines and bit lines constituting the matrix of memory cells are arranged with the minimum processing pitch in the chip, whereby the defects of short circuit described above occur most frequently at the portion of the matrix of memory cells than other part of the chip. Particularly, if the defect of short circuit occurs between the bit line and the word line, the current consumption of the chip increases in the stand-by state.

That is, since the word line is fixed at 0V (Vss) in the stand-by state and the bit line is fixed at Vcc/2, the load of a Vcc/2 power supply which is a precharge potential generating circuit for bit lines becomes larger and the current consumption increases if an output of the Vcc/2 power supply is short-circuited to the Vss potential node.

The above state is explained with reference to the accompanying drawings.

FIG. 1 shows an example of the arrangement of a memory cell array and a sense amplifier section. An N-type sense amplifier formed of an N-type MOS transistor, a P-type sense amplifier formed of a P-type MOS transistor, a bit line precharger and a data transfer gate are connected between a bit line BLS and a complementary bit line /BLS of the sense amplifier section. The above circuits are commonly used by cell arrays A and B arranged on both sides of the sense amplifier and the bit lines in the sense amplifier section are connected to or disconnected from the bit lines in the cell array sections according to two control signals øA, øB. More specifically, the bit line BLA and the complementary bit line /BLA thereof contained in the cell array A are respectively connected to the bit line BLS and the complementary bit line /BLS of the sense amplifier section by activating the control signal øA, and the bit line BLB and the complementary bit line /BLB thereof contained in the cell array B are respectively connected to the bit line BLS and the complementary bit line /BLS thereof by activating øB.

In the internal portion of the cell array, a plurality of word lines are arranged to cross a plurality of bit lines and memory cells are arranged at the intersections between the bit lines and the word lines.

FIG. 2 is a timing chart for illustrating the operation of the circuit of FIG. 1.

First, in the stand-by state, an EQ signal is activated (Vpp level), both of øA and øB are activated, and the potentials of all of the bit lines are precharged to Vcc/2 by the bit line precharger. SAN and SAP are also precharged to Vcc/2 like the bit lines and the sense amplifier is kept at the non-active state.

Further, the potential of a column selection signal line CSL is fixed at Vss, that is, 0V, and the bit lines BLS, /BLS and the data lines D, /D are electrically isolated.

Further, the potential of the word line is fixed at Vss, that is, 0V.

When access to the memory cell is started, the EQ signal is disabled, and one of øA and øB is non-activated. That is, one of the cell arrays corresponding to one of øA and øB which is kept activated is connected to the sense amplifier. In this example, since øB is non-activated and øA is kept activated, BLA and /BLA are respectively connected to BLS and /BLS, when BLB and /BLB is disconnected from BLS and /BLS.

Next, the word line is activated to transfer data of the memory cell to the bit line and the potential of the bit line is slightly changed from the precharge potential of Vcc/2.

The variation amount (ΔV) is expressed by the following equation based on the capacitance Cs of the memory cell, the capacitance CB of the bit line and Vcc.

$$\Delta V = (\tfrac{1}{2}) Vcc \times (Cs/CB)$$

In this case, the bit line capacitance CB can be expressed by the following equation by use of the capacitance CBA of the bit line BLA of the cell array section, the capacitance CBS of the bit line BLS of the sense amplifier section and the cell capacitance Cs.

$$CB = CBA + CBS + Cs$$

Next, the potential of SAN is changed to Vss, the potential of SAP is changed to Vcc, data on the bit line is amplified and the potentials of the paired bit lines are driven to Vcc and Vss, respectively.

Further, if CSL is selectively activated from Vss to Vcc, bit line pair BLS and /BLS are respectively connected to data line pair D and /D, and the data on BLS and /BLS are transferred to D and /D.

In the operation of the DRAM described above, as the precharge potential of the bit line and that of the word line differ from each other, the bit line is precharge to Vcc/2 and the word line is precharged to Vss, a power consumption becomes a serious problem when the defect of short circuit occurs between the bit line and the word line. That is, if the defect of short circuit occurs between the bit line and the word line, a wasteful current flows between the Vcc/2 power supply and the Vss power supply, thereby increasing the current consumption in the whole chip.

The problem is schematically shown in FIG. 3.

The word line is connected to the Vss power supply and the bit line is connected to the Vcc/2 power supply in the stand-by state, but if the short circuit occurs between them, a current flows in a path as indicated by an arrow in FIG. 3. In the manufacturing specification of the DRAM, generally, a current in the stand-by state is set to be smaller than in the operative state and an increase in the power consumption described above raises the possibility that the chip may be treated as a defective product, even if the defective bit line is replaced by a redundant one.

A known method for solving the above problem is disclosed in "Fault-Tolerant Designs for 256 Mb DRAM" by Toshiaki Kirihata et al., IEICE Trans. Electron Vol. E79-C, No. 7, July 1996, pp. 969–977. In this article, a method for suppressing a current when the defect of short circuit occurs between the bit line and the word line by mounting a current limiting element T as shown in FIG. 4 on the precharge circuit for bit lines is disclosed.

That is, a current flowing between a node A and a node B is limited by inserting a diode-connected N-type MOS transistor T between the node A of the bit line precharge circuit and the node B connected to the output of the Vcc/2 power supply. The transistor T is a depletion type transistor which has a threshold voltage lower than the transistors used in the N-type MOS sense amplifier and can permit a current corresponding to the potential difference between the source and the drain to flow even if the voltage between the source and the gate is 0V, although the current amount is extremely small and is suppressed to approximately 15 μA at maximum. By using the depletion type transistor, a path between the nodes A and B is not completely cut off. Therefore, the bit line can be precharged and since the current is suppressed to 15 μA at maximum, a current of 15 μA or more is not consumed for each defective portion even if the defect of short circuit occurs between the bit line and the word line.

However, with the above method, the total amount of power consumption caused by the short circuit current increases with the number of defective portions. That is, since the current limiting element only defines the upper limit of the current caused by the defect of short circuit in one place, a current proportional to the number of defective portions may flow if the defects of short circuit occur in many portions. Therefore, if the number of defects of short circuit becomes larger, it is anticipated that the stand-by current cannot satisfy the specification and the chip may be treated as a defective product.

If a current permitted to flow in one current limiting element is set to an extremely small value, the above problem can be solved. That is, if the current is limited to 1/10 times, the power consumption can be kept constant even if the number of defective portions of short circuit is increased by 10 times.

However, in the above known reference, since the bit line is precharged via the current limiting element, time required for precharging the bit line becomes long if the current amount permitted to flow in the current limiting element is limited to an extremely small value, and therefore, the current cannot be limited to a smaller value than necessary. Even if the current amount permitted by the current limiting element is set to the minimum permissible value which satisfies the required precharge time, an increase in the power consumption proportional to the number of defects of short circuit cannot be avoided.

BRIEF SUMMARY OF THE INVENTION

An object of this invention is to provide a semiconductor memory device which can prevent the power consumption proportional to the number of defects from increasing even if a large number of defects of short circuit between the bit line and the word line occur.

In order to attain the above object, a dynamic semiconductor memory device according to a first aspect of this invention comprises a bit line pair including a bit line and a complementary bit line; a word line arranged to cross the bit line substantially at right angles; data transfer gates each connected to the bit line and complementary bit line, each of the data transfer gates having a first control terminal for controlling a conduction state of the transfer gate; a column selection line connected to the first control terminal of each of the data transfer gates; a charging circuit having an input terminal and two output terminals, the two output terminals of the charging circuit being connected to the bit line and the complementary bit line; a current limiting element having a conduction path and a second control terminal for controlling a conduction state of the conduction path, one end of the conduction path of the current limiting element being connected to the input terminal of the charging circuit and the second control terminal being connected to the column selection line; and first potential supplying means connected to the other end of the conduction path of the current limiting element, for applying a first potential.

A dynamic semiconductor memory device according to a second aspect of this invention comprises a plurality of bit line pairs each including a bit line and a complementary bit line; a plurality of word lines arranged to cross the plurality of bit line pairs substantially at right angles; data transfer gates each connected to the bit line and the complementary bit line, each of the data transfer gates having a first control terminal for controlling a conduction state of the transfer gate; a plurality of column selection lines provided for the plurality of bit line pairs, each of the plurality of column selection lines being connected to the first control terminal of each of the data transfer gates connected to a corresponding one of the plurality of bit line pairs; a charging circuit connected between the bit line and the complementary bit line of each of the plurality of bit line pairs, the charging circuit including a first N-type MOS transistor having first source and drain terminals and a first gate electrode and a second N-type MOS transistor having second source and drain terminals and a second gate electrode, one of the first source and drain terminals being connected to the bit line, the other of the first source and drain terminals being connected to one of the second source and drain terminals of the second N-type MOS transistor, and the other of the second source and drain terminals of the second N-type MOS transistor being connected to the complementary bit line; a third N-type MOS transistor of depletion type having third source and drain terminals and a third gate electrode, one of the third source and drain terminals of the third N-type MOS transistor being connected to the other of the first source and drain terminals of the first N-type MOS transistor; a power supply connected to the other of the third source and drain terminals of the third N-type MOS transistor, for supplying a first potential; and CSL potential supplying means for selectively supplying a negative voltage to at least one of the column selection lines to make the third N-type MOS transistor non-conductive.

With the above construction, the dynamic semiconductor memory device of this invention includes the charging circuit arranged for each bit line pair and a depletion type current limiting element having one end connected to the charging circuit, the other end connected to the first potential supplying means (power supply) and the gate connected to the column selection line. Thus, in a case wherein the bit line which is contained in the bit line pair and the word line are short-circuited, a path of current flowing from the first power supply supplying means to the word line via the bit line pair can be interrupted by supplying a negative voltage to the gate of the current limiting element from a corresponding one of the column selection lines, and thus, an increase in the power consumption can be prevented.

The current limiting element can be provided for each of the plurality of bit line pairs.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

There will now be described embodiments of this invention with reference to the accompanying drawings.

(First Embodiment)

Figure 5:
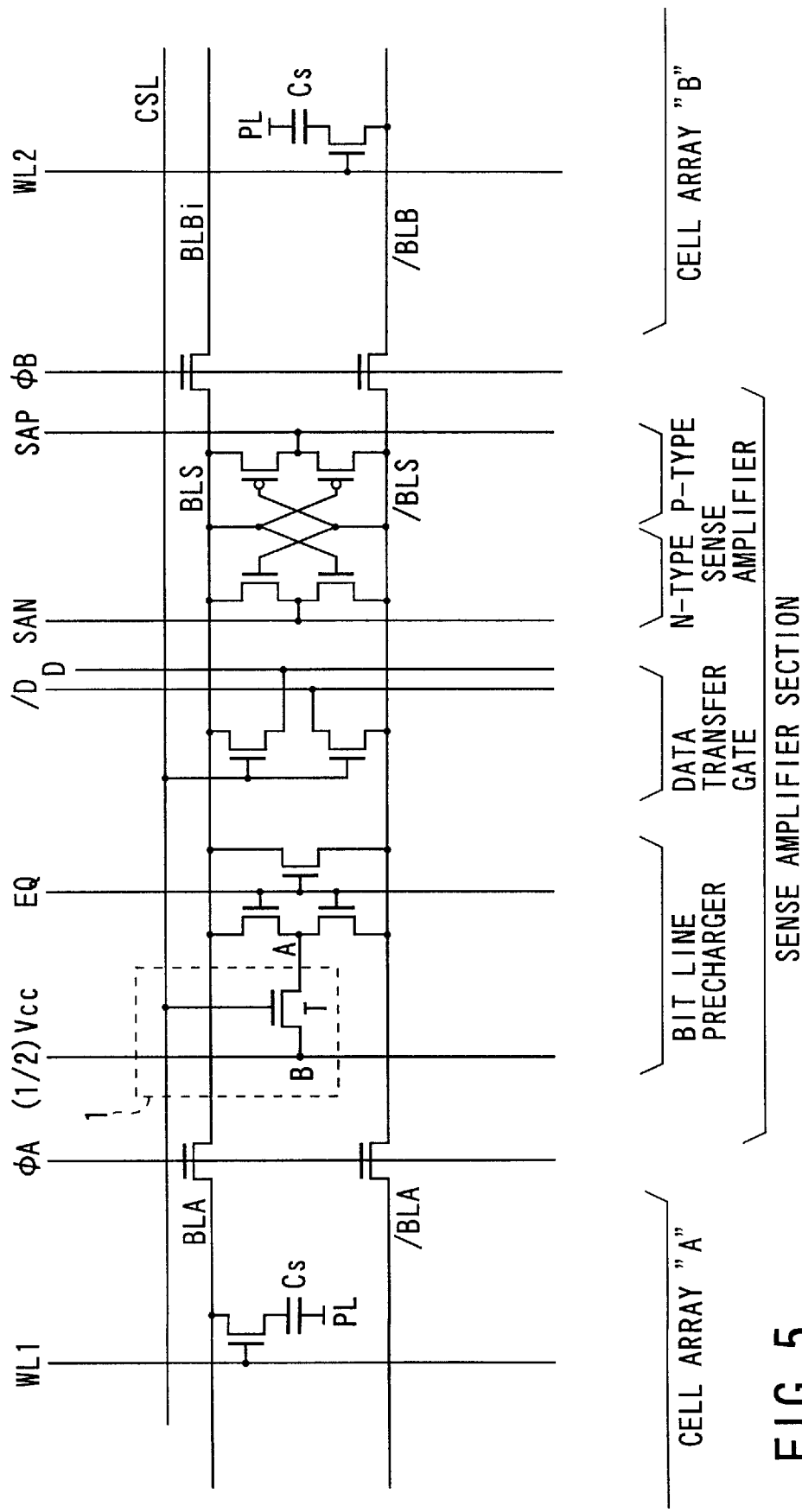
FIG. 5 is a circuit diagram showing a sense amplifier section for a DRAM according to a first embodiment of this invention.

FIG. 5 shows the circuit construction of a DRAM according to a first embodiment of this invention and shows the arrangement of a circuit associated with the bit lines of the cell array section and the sense amplifier section of the DRAM.

In this embodiment, a depletion type NMOS transistor T which is a current limiting element 1 is connected between a node A of a charging circuit (which is hereinafter referred to as a precharger) for bit lines whose conduction state is controlled by an EQ signal and a node B connected to the output of a Vcc/2 power supply and the gate electrode of the transistor T is connected to a column selection line CSL.

In the stand-by state of the DRAM for precharging the bit lines, generally, all of the column selection lines are set in the non-selection state and fixed at a first potential Vss. In order to precharge the bit lines even in this state, a depletion type NMOS transistor which is not completely turned OFF even if the gate thereof is set at the Vss potential is used as the transistor T.

Figure 1:
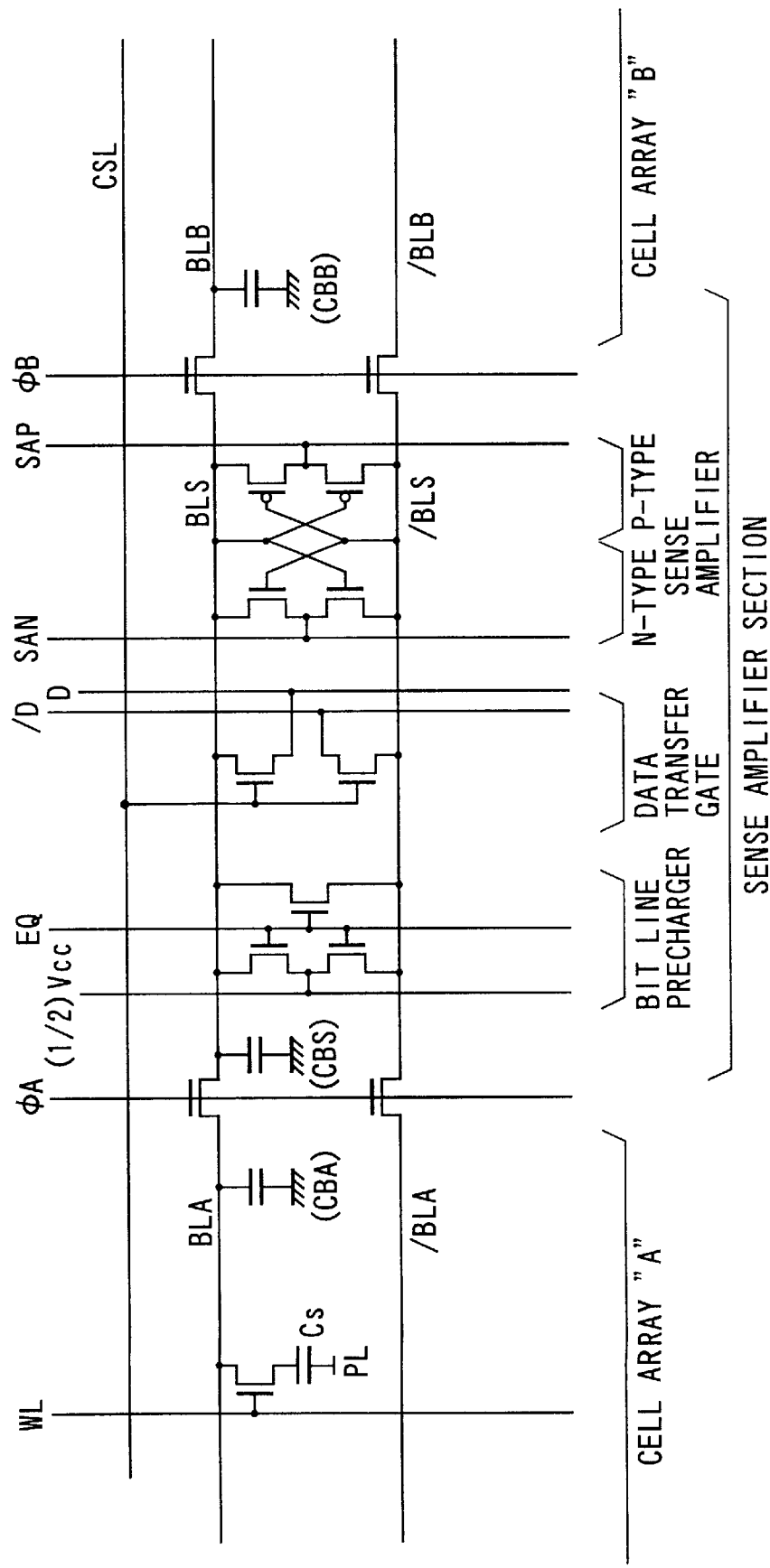
FIG. 1 is a circuit diagram showing the construction of a sense amplifier section for a conventional DRAM.
Figure 2:
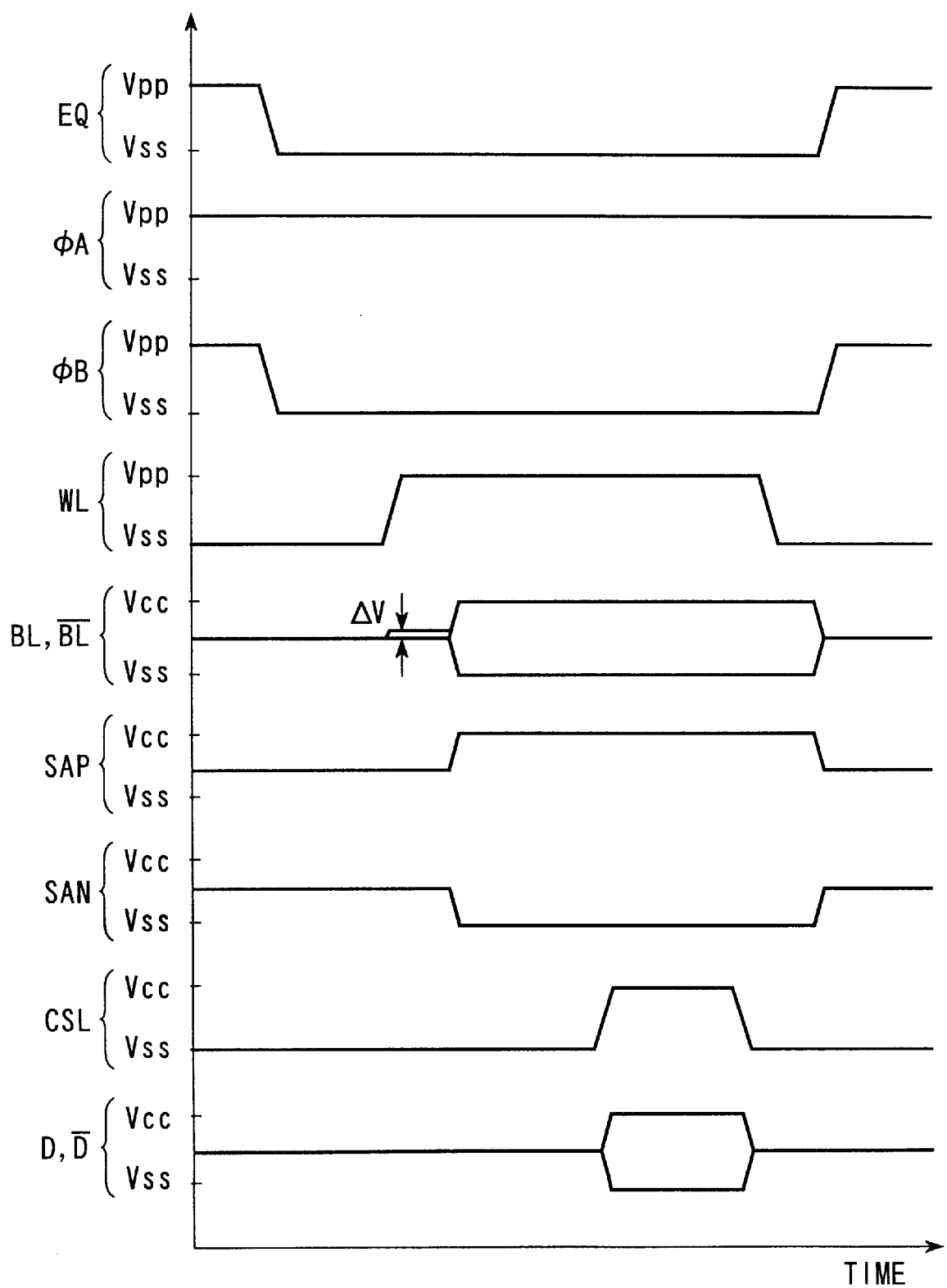
FIG. 2 is a timing chart for illustrating the operation of the DRAM of FIG. 1.
Figure 3:
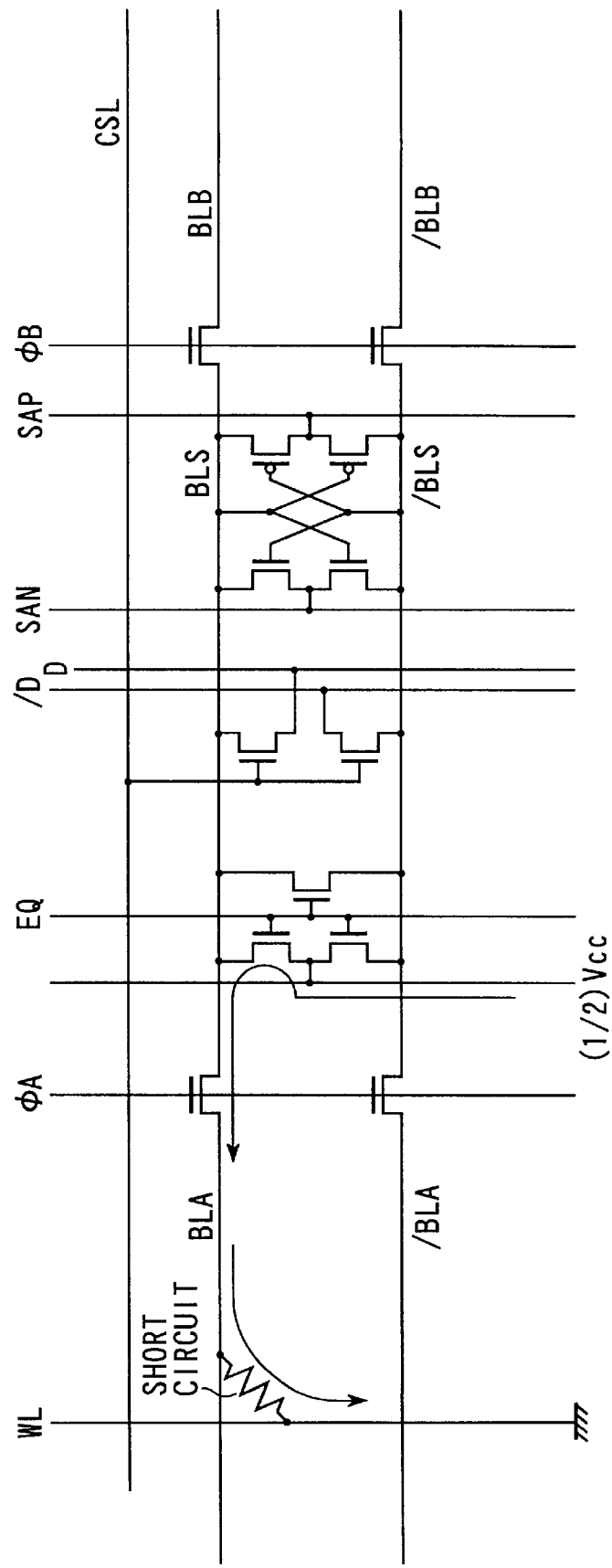
FIG. 3 is a diagram for illustrating the problem caused when the word line and bit line are short-circuited in the conventional DRAM.

Like the operation in the prior art explained with reference to FIG. 2, two potentials including a first potential Vss at the time of non-selection and a second potential Vcc at the time of selection are supplied to the column selection line CSL. In addition with these two potentials, when the defect of short circuit occurs between the bit line and the word line, the precharge current is limited by supplying a third potential −V to CSL in this embodiment. That is, the third potential is a negative potential and a current flowing between the source and the drain of the transistor T is completely cut off by applying the potential to the gate electrode of the depletion type NMOS transistor T.

Figure 4:
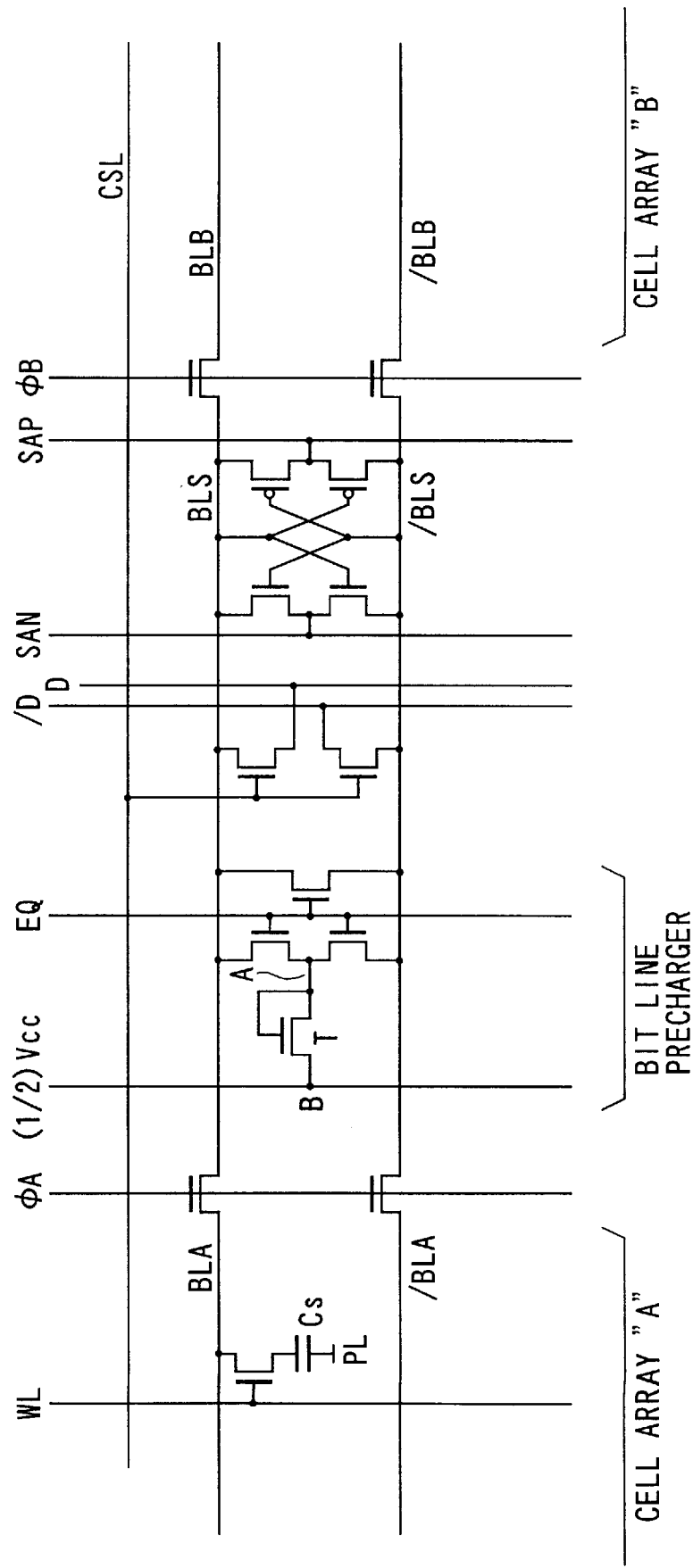
FIG. 4 is a circuit diagram showing another construction of a sense amplifier section for a conventional DRAM.

That is, the effect of this invention is that the upper limit of the current amount can be reduced for each of the bit lines connected to the column selection line by lowering the gate potential of the transistor T in comparison with the prior art technique shown in FIG. 4. Since the transistors T are controlled by use of the column selection lines which are already formed on substantially the entire surface of the memory cell area, it is not necessary to increase the area of the memory cell area for the sake of the above control.

Figure 6:
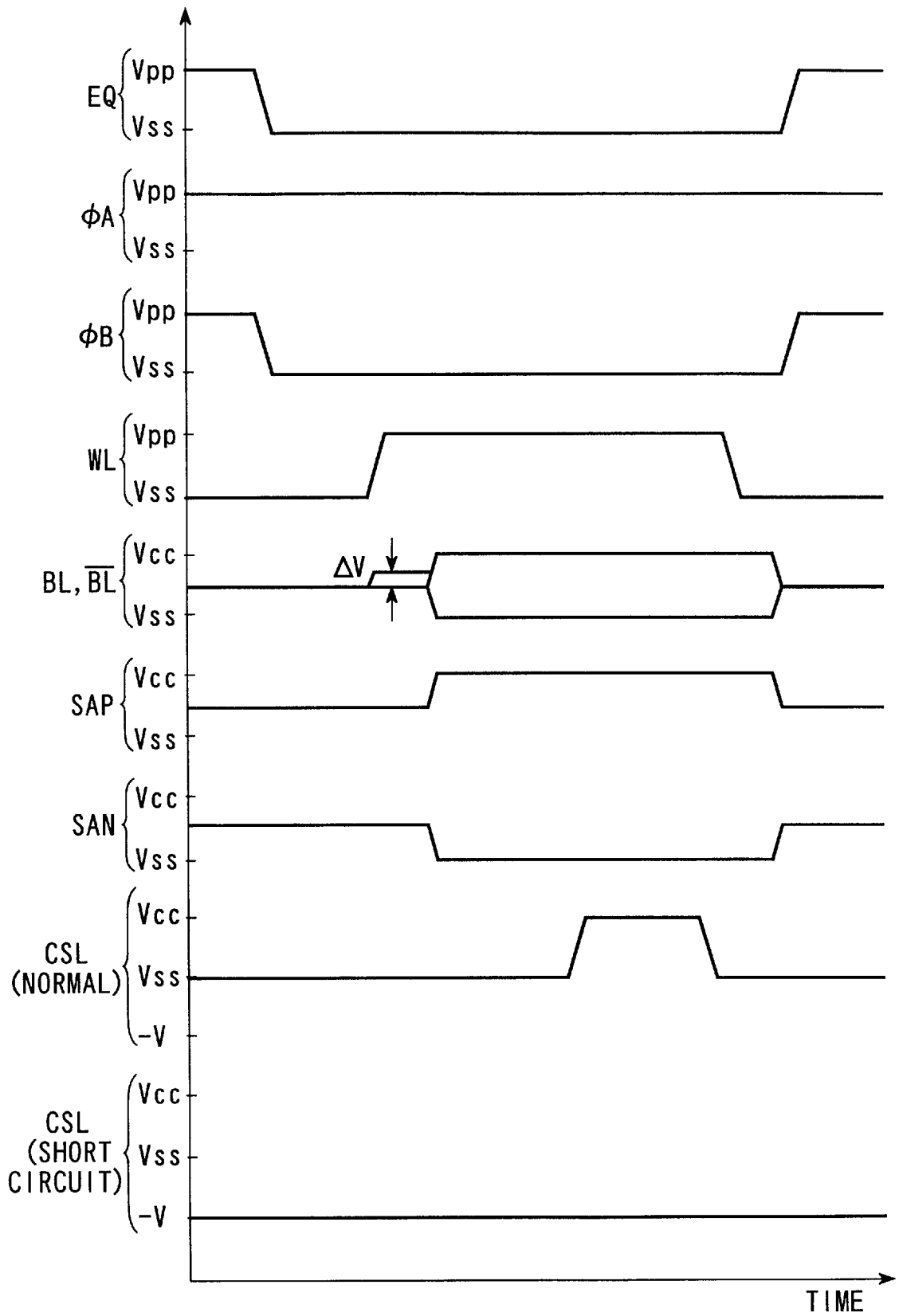
FIG. 6 is a timing chart for illustrating the operation of the DRAM of FIG. 5.

FIG. 6 is a timing chart for illustrating the operation of this embodiment. The operations of the column selection line CSL in a case wherein the defect of short circuit between the bit line and the word line does not occur (Normal) and in a case wherein the defect of short circuit occurs (Short Circuit) are shown.

In a state wherein the defect of short circuit does not occur, the column selection line CSL is selectively controlled to one of two types values including the first potential Vss indicating the non-selection state and the second potential Vcc indicating the selected state as is explained in "BACKGROUND OF THE INVENTION". However, when the defect of short circuit occurs, the column selection line CSL is fixed at the third potential −V.

That is, since the gate potential of the current limiting transistor T is set to a negative value, no current flows between the source and the drain of the transistor T. As a result, a current caused by the short circuit between the word line and the bit line between the Vss power supply for applying the potential to the word line and the Vcc/2 power supply for applying the potential to the bit line does not flow. In this case, the column selection line CSL is kept fixed at the third potential −V. That is, since the column selection line CSL is not set at the potential Vcc of the selected state, the bit line connected to the column selection line CSL fixed at −V is not connected to the data line.

However, since data of the memory cell cannot be correctly read out if the short circuit occurs between the bit line and the word line, the bit line connected to the column selection line CSL is replaced by a redundant bit line by a redundancy circuit separately provided. For this reason, there occurs no problem in the operation of the DRAM.

Figure 7:
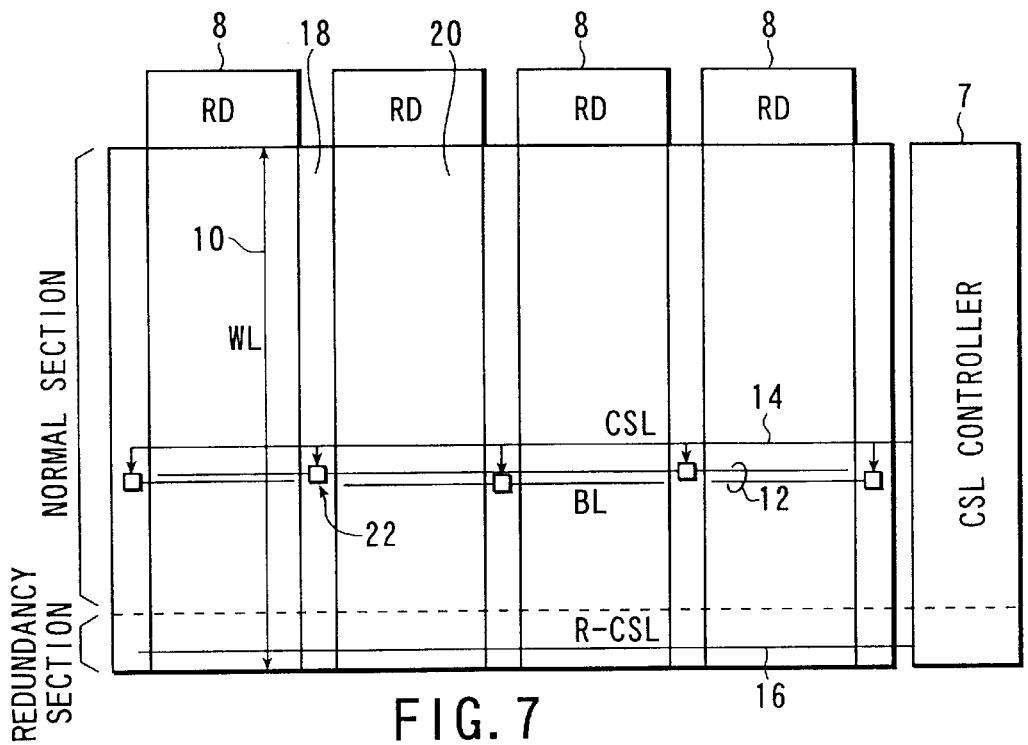
FIG. 7 is a plan view schematically showing the arrangement of a memory cell array of the DRAM according to the first embodiment of this invention.

FIG. 7 is a schematic plan view showing the arrangement of a plurality of divided cell array areas 20, sense amplifier areas 18, and a CSL controller 7. The cell array areas 20 correspond to the cell arrays "A" and "B" of FIG. 5, and the sense amplifier areas 18 correspond to the sense amplifier section of FIG. 5.

The memory cell areas 20 and the sense amplifier areas 18 are alternately arranged and the column selection line CSL is commonly used by a plurality of sense amplifier areas 18. A row decoder 8 is provided for each of the cell array areas 20 and word lines 10 are selectively activated by the row decoder 8.

A normal memory section and redundancy memory section are provided in the cell array area 20 and sense amplifier area 18 and, for example, if a defect occurs in the bit line, the redundancy memory is accessed instead of the normal memory. As described above, when the short circuit occurs between the word line and the bit line in the normal memory section, the potential of −V is applied to a corresponding one of the column selection lines CSL and the column selection line is replaced by R-CSL of the redundancy memory section is used.

In the sense amplifier area 18 of FIG. 7, the bit line precharging circuit using the current limiting element T of this invention, the sense amplifier and the data transfer gate shown in FIG. 5 are provided. Since connection to the current limiting element T is attained simply by making the gate electrode thereof in contact with the column selection line CSL, the manufacturing process can be simplified in comparison with a case for forming the contact between the gate electrode and the source electrode lying in a space between the bit lines which is strictly small in the prior art. Therefore, the defect of the contact to the source electrode or the defect of opening due to the aspect ratio and the positional deviation of a mask can be improved in this invention.

Figure 8:
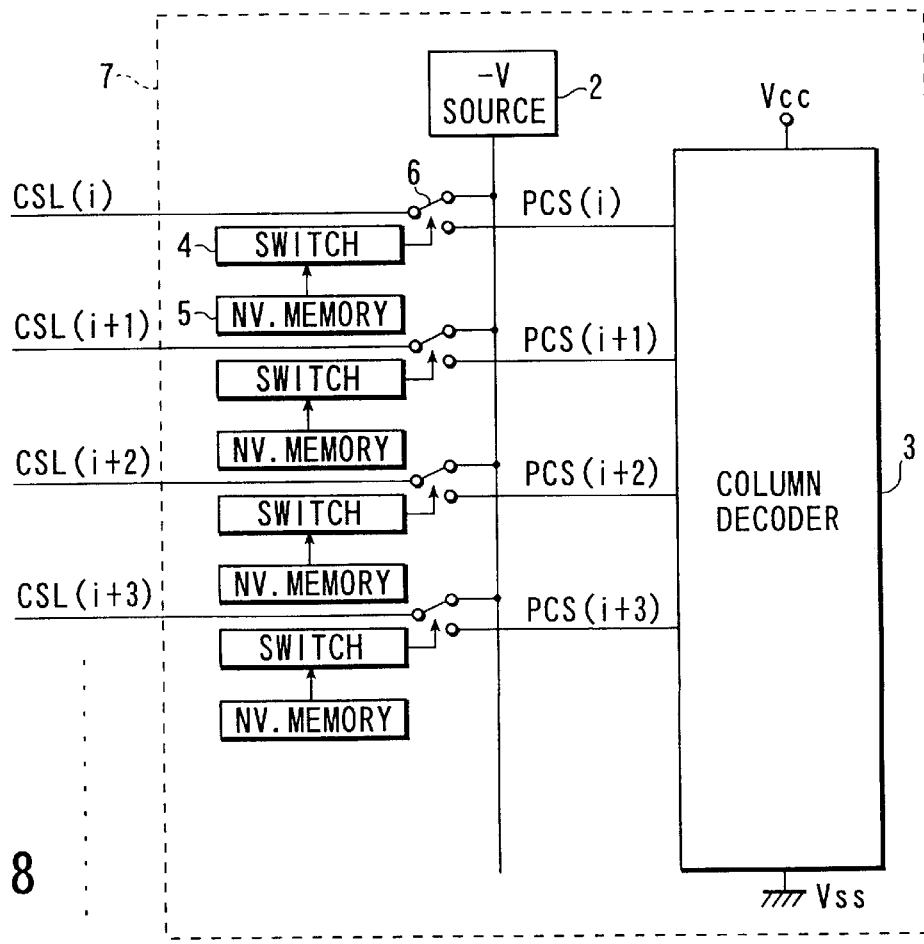
FIG. 8 is a block diagram showing the construction of a column selection control circuit of the DRAM according to the first embodiment of this invention.

FIG. 8 is a block diagram showing a concrete example of the column selection line control circuit 7 shown in FIG. 7.

In FIG. 8, a column decoder 3 for generating signals PCS each of which is controlled to two potentials including a first potential Vss indicating the non-selection state of a corresponding one of the column selection lines CSL and a second potential Vcc indicating the selected state thereof and switching circuits 4 each for selectively applying the signal PCS or a third potential −V generated from a negative voltage generating circuit 2 to a corresponding one of the column selection lines CSL are shown. The signal PCS corresponds to a column selection signal whose amplitude varies between two power supply voltages of Vss and Vcc in the prior art.

In this embodiment, the switching circuits 4 for selectively supplying PCS or −V are respectively provided for the column selection lines CSL. Further, nonvolatile memory circuits 5 are respectively provided for the switching circuits 4 and each of the switching circuits 4 may selectively supply PCS or −V to the corresponding column selection line CSL according to the stored contents of the memory circuit. The stored contents of the nonvolatile memory circuit are used to determine whether the potential of the column selection line is connected to PCS or −V. The content of the nonvolatile memory circuit are predetermined to connect the column selection line to PCS, although they can be changed to connect the column selection line to −V, if the defect of short circuit is detected by the operation test effected after the processing of the chip. The nonvolatile memory circuit can use a PROM or fuse which may be cut off by use of laser light after the processing of the chip.

Figure 9:
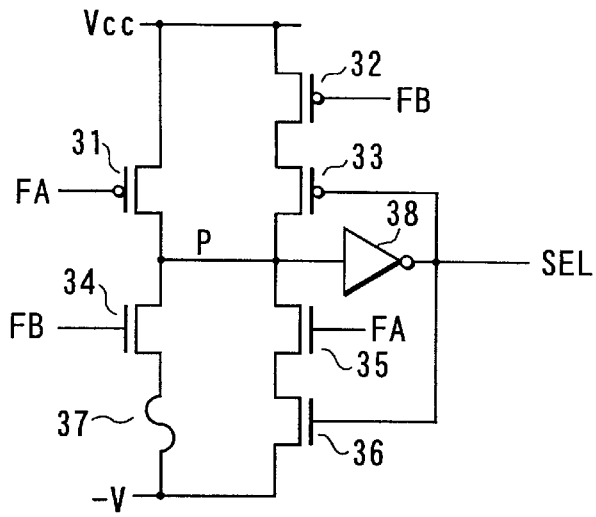
FIG. 9 is a circuit diagram of an NV (nonvolatile) memory of FIG. 8 indicating a case wherein a fuse is not cut off.
Figure 11:
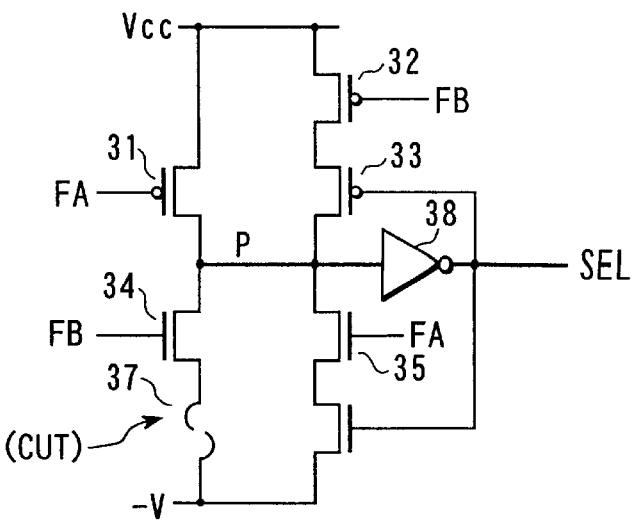
FIG. 11 is a circuit diagram of the NV memory of FIG. 8 indicating a case wherein a fuse is cut off.

FIG. 9 is a circuit diagram showing a concrete example of the nonvolatile memory circuit of FIG. 8. A nonvolatile memory circuit including PMOS transistors 31 to 33, NMOS transistors 34 to 36, a fuse 37 and an inverter 38 is connected between a power supply node Vss and a ground potential node Vcc. FIG. 11 shows a circuit in which the fuse 37 is cut off. The circuit is operated as follows.

Figure 10:
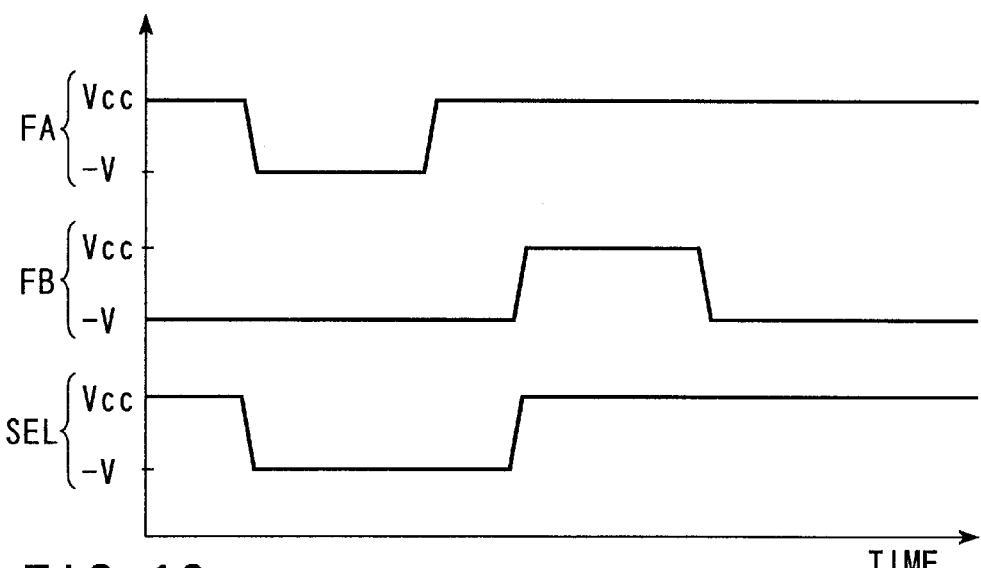
FIG. 10 is a timing chart for illustrating the operation of the circuit of FIG. 9.
Figure 12:
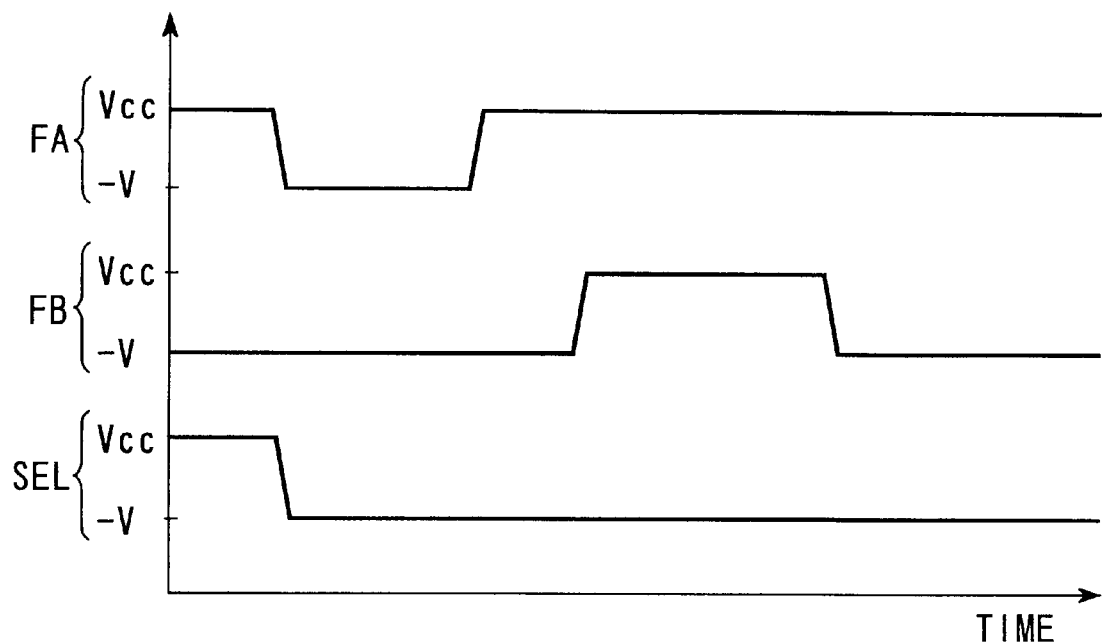
FIG. 12 is a timing chart for illustrating the operation of the circuit of FIG. 11.

FIGS. 10 and 12 are timing charts for illustrating the operations of the circuits shown in FIGS. 9 and 11. At the time of turn-ON of the power supply, a control signal FA is temporarily changed from the "H" level (Vcc) to the "L" level (−V) and the potential of a node P is set to the "H" level (Vcc). After this, the control signal FA is fixed at the "H" level (Vcc). Then, a control signal FB which is kept at the "L" level (−V) is temporarily changed to the "H" level (Vcc).

If the fuse 37 is not cut off, charges stored on the node P are extracted by the potential −V via the fuse 37, and as a result, the potential of the node P is set to the "L" level (−V). An output signal (selection signal) SEL which has been set to the "L" level (−V) in synchronism with the fall of the control signal FA is changed to the "H" level (Vcc) when the potential of the node P is changed to the "L" level and the output signal is kept at this level by the circuit (FIG. 10).

As shown in FIG. 11, if the fuse 37 is cut off, the potential of the node P is held at the "H" level after the control signal FA falls. Therefore, the output signal SEL is held at the "L" level after the fall of the control signal FA (FIG. 12).

Figure 13:
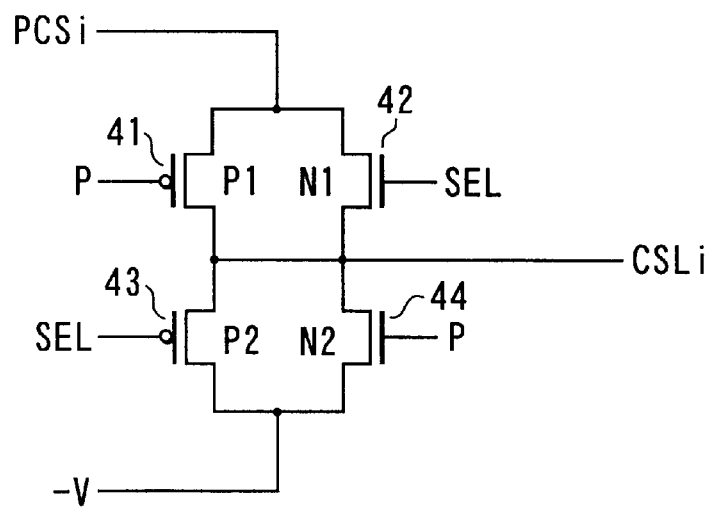
FIG. 13 is a circuit diagram showing a concrete example of a switching circuit of FIG. 8.

FIG. 13 shows a concrete circuit of the switching circuits 4, 6 of FIG. 8. The signals P and SEL shown in FIG. 9 or 11 are selectively supplied to the gate electrodes of P-type MOS transistors 41, 43 and N-type MOS transistors 44, 42 of the switching circuit as shown in FIG. 13. If the fuse is not cut off, SEL=Vcc, P=−V and the transistors 41, 42 are made conductive so that the output PCSi of the column decoder 3 will be connected to the column selection line CSLi.

If the fuse is cut off, SEL=−V, P=Vcc and the transistors 43, 44 are made conductive so that the output −V of the negative potential power supply will be connected to the column selection line CSLi.

In this embodiment, the fuse is not originally cut off after the fabrication process. If the short circuit defect between the word line and the bit line is found in the operation test, the fuse of corresponding column selection line is cut off and the corresponding column selection line is set to −V to eliminate the waste current caused by the short circuit defect.

(Second Embodiment)

Figure 14:
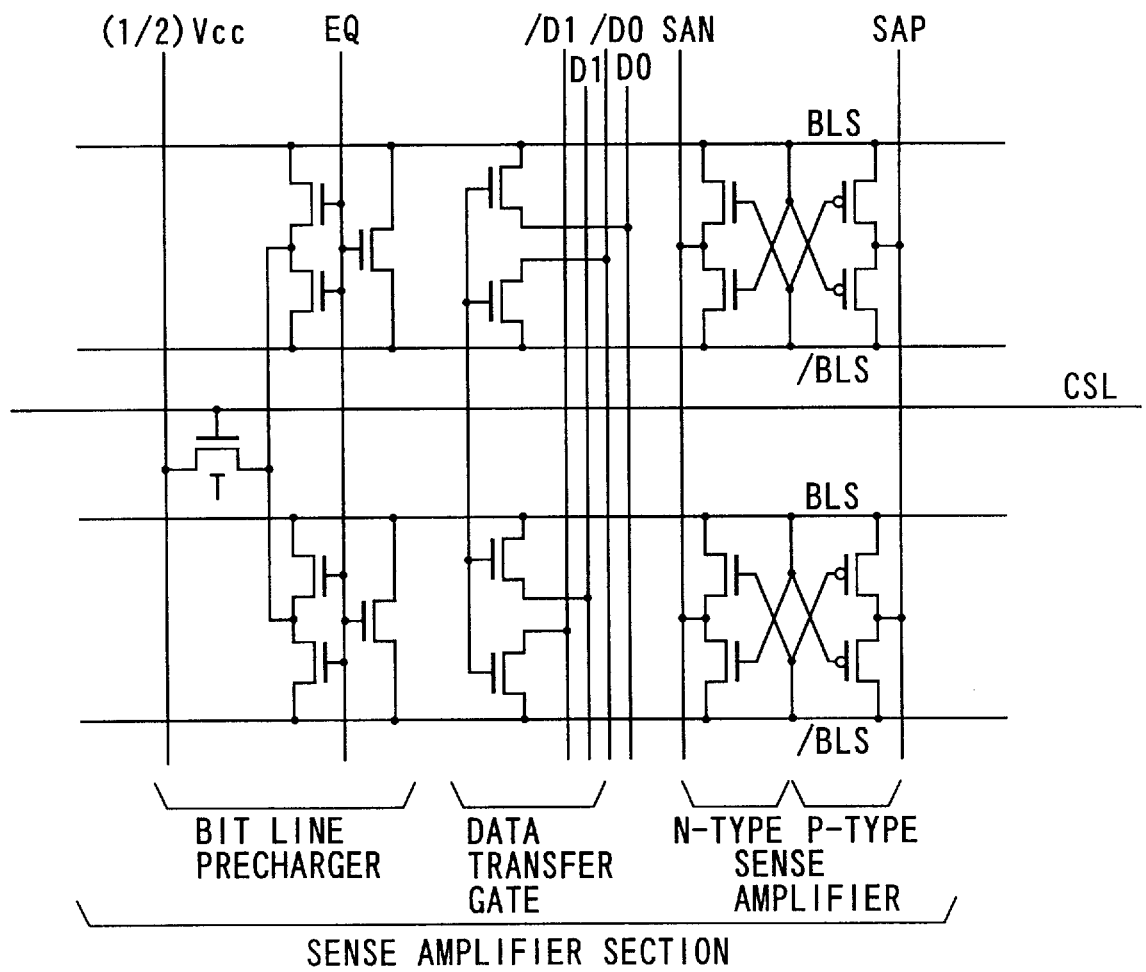
FIG. 14 is a circuit diagram of a sense amplifier section of a DRAM according to a second embodiment of this invention.

FIG. 14 is a circuit diagram of a sense amplifier section of a DRAM according to a second embodiment of this invention. In the second embodiment, each column selection line CSL is commonly used by adjacent two bit line pairs.

In this case, two sets of four data lines D0, /D0, D1, /D1 are arranged for each sense amplifier section and if one column selection line CSL is activated, the four bit lines shown in FIG. 14 are connected to the respective data lines. Like the first embodiment, the gate electrode of a current limiting transistor T is connected to the column selection line and the current limiting transistor is commonly used by the four bit lines shown in FIG. 14. That is, each current limiting element is provided for every bit lines of 2 to the n-th (n≧1) (in this embodiment, n=2) power and commonly used by the bit lines. Thus, the number of current limiting elements can be reduced.

Further, in the first embodiment, the number of current limiting elements is the same as that of column selection lines, but even if a plurality of current limiting elements are provided for the same column selection line, the object of this invention can be attained.

According to this invention, it is possible to provide a semiconductor memory device in which a current path in the stand-by state can be cut off even if the defect of short circuit between the bit line and the word line occurs by using the current limiting element controlled by the column selection line, for selectively limiting a precharge current for a bit line in the precharge circuit for the bit lines.

Additional advantages and modifications will readily occurs to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

I claim:

1. A dynamic semiconductor memory device, comprising:
   a bit line pair including a bit line and a complementary bit line;
   a word line arranged to cross said bit line substantially at right angles;
   data transfer gates each connected to said bit line and complementary bit line, each of said data transfer gates having a first control terminal for controlling a conduction state of said transfer gate;
   a column selection line connected to said first control terminal of each of said data transfer gates;
   a charging circuit having an input terminal and two output terminals, said two output terminals of said charging circuit being respectively connected to said bit line and said complementary bit line;
   a current limiting element having a conduction path and a second control terminal for controlling a conduction state of said conduction path, a first end of said conduction path of said current limiting element being connected to said input terminal of said charging circuit and said second control terminal being connected to said column selection line; and
   first potential supplying means connected to a second end of said conduction path of said current limiting element, for applying a first potential thereto, wherein said current limiting element is a depletion type NMOS transistor which has source and drain terminals and a gate electrode and said current limiting element threshold voltage is negative, said first and second ends of said conduction path being said source and drain terminals and said second control terminal being said gate electrode.

2. A dynamic semiconductor memory device according to claim 1, further comprising CSL potential supplying means connected to said column selection line, said CSL potential supplying means supplying a second potential to said column selection line to open said data transfer gates, supplying a third potential to close said data transfer gates, and supplying a fourth potential to cut off said conduction path of said current limiting element.

3. A dynamic semiconductor memory device according to claim 2, wherein said CSL potential supplying means includes a column decoder for selectively outputting said second and said third potential; a negative voltage generating circuit for generating a negative voltage which is said fourth potential; a switching circuit for selectively switching one of said second and said third potential output from said column decoder and said fourth potential output from said negative voltage generating circuit to output to said column selection line; and nonvolatile memory means for memorizing either of a first and a second status to drive said switching circuit to selectively output said second and said third potential to said column selection line when said first status is memorized and to drive said switching circuit to output said fourth potential when said second status is memorized.

4. A dynamic semiconductor memory device according to claim 3, wherein said nonvolatile memory means includes a fuse element.

5. A dynamic semiconductor memory device according to claim 3, wherein a memory content of said nonvolatile memory means is originally set to said first status and said memory content is changeable to said second status.

6. A dynamic semiconductor memory device comprising:
   a plurality of bit line pairs each including a bit line and a complementary bit line;
   a plurality of word lines arranged to cross said plurality of bit line pairs substantially at right angles;
   data transfer gates each connected to said bit line and said complementary bit line, each of said data transfer gates having a first control terminal for controlling a conduction state of said transfer gate;
   a plurality of column selection lines provided for said plurality of bit line pairs, each of said plurality of column selection lines being connected to said first control terminal of each of said data transfer gates connected to a corresponding one of said plurality of bit line pairs;
   a charging circuit connected between said bit line and said complementary bit line of each of said plurality of bit line pairs, said charging circuit including a first N-type MOS transistor having first source and drain terminals and a first gate electrode and a second N-type MOS transistor having second source and drain terminals and a second gate electrode, one of said first source and drain terminals being connected to said bit line, the other of said first source and drain terminals being connected to one of said second source and drain terminals of said second N-type MOS transistor, and the other of said second source and drain terminals of said second N-type MOS transistor being connected to said complementary bit line;
   a third N-type MOS transistor of depletion type having third source and drain terminals and a third gate electrode, one of said third source and drain terminals of said third N-type MOS transistor being connected to the other of said first source and drain terminals of said first N-type MOS transistor, said third gate electrode being connected to a corresponding one of said plurality of column selection lines;
   a power supply connected to the other of said third source and drain terminals of said third N-type MOS transistor, for supplying a first potential thereto; and
   CSL potential supplying means for selectively supplying a negative voltage to at least one of said column selection lines to make said third N-type MOS transistor non-conductive.

7. A dynamic semiconductor memory device according to claim 6, wherein said CSL potential supplying means supplies a second potential to said at least one of said column selection lines to open said data transfer gates, supplies a third potential to close said data transfer gates, and supplies a fourth potential which is said negative voltage to said third gate electrode of said third N-type MOS transistor to make said third N-type MOS transistor non-conductive.

8. A dynamic semiconductor memory device according to claim 7, wherein said CSL potential supplying means includes a column decoder for selectively outputting said second and said third potential; a negative voltage generating circuit for generating said negative voltage which is said fourth potential; a switching circuit for selectively switching one of said second and said third potential output from said column decoder and said fourth potential output from said negative voltage generating circuit to output to said column selection line; and nonvolatile memory means for memorizing either of a first and a second status to drive said switching circuit to selectively output said second and said third potential to said column selection line when said first status is memorized and to drive said switching circuit to output said fourth potential when said second status is memorized.

9. A dynamic semiconductor memory device according to claim 8, wherein said nonvolatile memory means includes a fuse element.

10. A dynamic semiconductor memory device according to claim 9, wherein a memory content of said nonvolatile memory means is originally set to said first status and said memory content is changeable to said second status.

11. A dynamic semiconductor memory device according to claim 10, wherein said nonvolatile memory means is provided for each of said plurality of column selection lines.

12. A dynamic semiconductor memory device comprising:
- a plurality of bit line pairs each including a bit line and a complementary bit line;
- a plurality of word lines arranged to cross said plurality of bit line pairs substantially at right angles;
- data transfer gates each connected to said bit line and said complementary bit line, each of said data transfer gates having a first control terminal for controlling a conduction state of said transfer gate;
- a plurality of column selection lines provided for every n (n is an integral number) pairs of bit lines among said plurality of bit line pairs, each of said plurality of column selection lines being connected to said first control terminal of each of said data transfer gates connected to said n pairs of bit lines among said plurality of bit line pairs;
- a charging circuit connected between said bit line and said complementary bit line of each of said plurality of bit line pairs, said charging circuit including a first N-type MOS transistor having first source and drain terminals and a first gate electrode and a second N-type MOS transistor having second source and drain terminals and a second gate electrode, one of the first source and drain terminals being connected to said bit line, the other of said first source and drain terminals being connected to one of said second source and drain terminals of said second N-type MOS transistor, and the other of said second source and drain terminals of said second N-type MOS transistor being connected to said complementary bit line;
- a third N-type MOS transistor of depletion type having third source and drain terminals and a third gate electrode, one of said third source and drain terminals of said third N-type MOS transistor being connected to the other of said first source and drain terminals of said first N-type MOS transistor connected to each of said n bit line pairs, said third gate electrode being connected to a corresponding one of said plurality of column selection lines;
- a power supply connected to the other of said third source and drain terminals of said third N-type MOS transistor, for selectively supplying a first potential; and
- CSL potential supplying means for supplying a negative voltage to at least one of said column selection lines to make said third N-type MOS transistor non-conductive.

13. A dynamic semiconductor memory device according to claim 12, wherein said CSL potential supplying means supplies a second potential to said column selection line to open said data transfer gate, supplies a third potential to close said data transfer gate, and supplies a fourth potential which is said negative voltage to said third gate electrode of said third N-type MOS transistor to make said third N-type MOS transistor non-conductive.

14. A dynamic semiconductor memory device according to claim 13, wherein said CSL potential supplying means includes a column decoder for selectively outputting said second and said third potential; a negative voltage generating circuit for generating said negative voltage which is said fourth potential; a switching circuit for selectively switching one of said second and said third potential output from said column decoder and said fourth potential output from said negative voltage generating circuit to output to said column selection line; and nonvolatile memory means for memorizing either of a first and a second status to drive said switching circuit to selectively output said second and said third potential to said column selection line when said first status is memorized and to drive said switching circuit to output said fourth potential when said second status is memorized.

15. A dynamic semiconductor memory device according to claim 14, wherein said nonvolatile memory means includes a fuse element.

16. A dynamic semiconductor memory device according to claim 14, wherein a memory content of said nonvolatile memory means is originally set to said first status and said memory content is changeable to said second status.

17. A dynamic semiconductor memory device, comprising:
- a bit line pair including a bit line and a complementary bit line;
- a word line arranged to cross said bit line substantially at right angles;
- data transfer gates each connected to said bit line and complementary bit line, each of said data transfer gates having a first control terminal for controlling a conduction state of said transfer gate;
- a column selection line connected to said first control terminal of each of said data transfer gates;
- a charging circuit having an input terminal and two output terminals, said two output terminals of said charging circuit being respectively connected to said bit line and said complementary bit line;
- a current limiting element having a conduction path and a second control terminal for controlling a conduction state of said conduction path, a first end of said conduction path of said current limiting element being connected to said input terminal of said charging circuit and said second control terminal being connected to said column selection line;
- first potential supplying means connected to a second end of said conduction path of said current limiting element, for applying a first potential thereto; and
- CSL potential supplying means connected to said column selection line, said CSL potential supplying means supplying a second potential to said column selection line to open said data transfer gates, supplying a third potential to close said data transfer gates, and supplying a fourth potential to cut off said conduction path of said current limiting element, wherein said CSL potential supplying means includes a column decoder for selectively outputting said second and said third potential, a negative voltage generating circuit for generating a negative voltage which is said fourth potential, a switching circuit for selectively switching one of said second and said third potential output from said column decoder and said fourth potential output from said negative voltage generating circuit to output to said column selection line, and nonvolatile memory means for memorizing either of a first and a second status to drive said switching circuit to selectively output said second and said third potential to said column selection line when said first status is memorized and to drive said switching circuit to output said fourth potential when said second status is memorized.

18. A dynamic semiconductor memory device according to claim 17, wherein said nonvolatile memory means includes a fuse element.

19. A dynamic semiconductor memory device according to claim 17, wherein a memory content of said nonvolatile memory means is originally set to said first status and said memory content is changeable to said second status.

* * * * *

UNITED STATES PATENT AND TRADEMARK OFFICE
CERTIFICATE OF CORRECTION

PATENT NO. : 6,018,481                                          Page 1 of 1
DATED      : January 25, 2000
INVENTOR(S) : Shinichiro Shiratake It is certified that error appears in the above-identified patent and that said Letters Patent is hereby corrected as shown below:

Title page,
Item [54], Title, delete "DYNAMIC SEMICONDUCTOR MEMORY DEVICE" and insert -- A PRECHARGED CIRCUIT SYSTEM FOR BIT LINES FOR SUPPRESSING CURRENT CONSUMPTION IN THE STANDBY STATE --.

Column 11, claim 10,
Line 9, delete "9" and insert -- 8 --.

Column 11, claim 11,
Line 13, delete "10" and insert -- 8 --.

Signed and Sealed this

Eighth Day of January, 2002

Attest:

JAMES E. ROGAN
Attesting Officer     Director of the United States Patent and Trademark Office